(12) United States Patent
Park et al.

(10) Patent No.: US 8,057,848 B2
(45) Date of Patent: Nov. 15, 2011

(54) METHOD OF FORMING ORGANIC SEMICONDUCTOR LAYER PATTERN

(75) Inventors: Jong-Jin Park, Guri-si (KR); Tae-Yong Noh, Gunpo-si (KR); Myeong-Suk Kim, Suwon-si (KR); Sung-Hun Lee, Seoul (KR); Eun-Jeong Jeong, Seongnam-si (KR); Dong-Woo Shin, Seoul (KR); Lyong-Sun Pu, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1142 days.

(21) Appl. No.: 11/453,930

(22) Filed: Jun. 16, 2006

(65) Prior Publication Data

US 2006/0286314 A1    Dec. 21, 2006

(30) Foreign Application Priority Data

Jun. 18, 2005    (KR) .................. 10-2005-0052720

(51) Int. Cl.
*B05D 5/06* (2006.01)
*B05D 3/06* (2006.01)
*B41M 3/12* (2006.01)

(52) U.S. Cl. ........... 427/66; 427/146; 427/545; 427/557

(58) Field of Classification Search ............... 427/66, 427/545, 554–558, 146
See application file for complete search history.

(56) References Cited

U.S. PATENT DOCUMENTS

| | | | | |
|---|---|---|---|---|
| 5,512,654 | A * | 4/1996 | Holmes et al. | 528/373 |
| 6,165,383 | A * | 12/2000 | Chou | 252/301.16 |
| 6,242,152 | B1 * | 6/2001 | Staral et al. | 430/201 |
| 2003/0064248 | A1 * | 4/2003 | Wolk et al. | 428/690 |
| 2003/0178935 | A1 * | 9/2003 | Nishimura et al. | 313/498 |
| 2004/0108047 | A1 * | 6/2004 | Afzali-Ardakani et al. | 156/230 |
| 2004/0151829 | A1 * | 8/2004 | Boroson et al. | 427/64 |
| 2005/0121667 | A1 * | 6/2005 | Kuehl et al. | 257/40 |

FOREIGN PATENT DOCUMENTS

CN    1541504    10/2004

OTHER PUBLICATIONS

Herwig et al.; "A Soluble Pentacene Precursor: Synthesis, Solid-State Conversion into Pentacene and Application in a Field-Effect Transistor", Advanced Materials, vol. 11, No. 6, p. 480-483; 1999.*

Office action from Chinese Patent Office issued in Applicant's corresponding Chinese Patent Application No. 200610092596.8 dated Feb. 25, 2010 and its English translation.

* cited by examiner

*Primary Examiner* — James Lin
(74) *Attorney, Agent, or Firm* — Robert E. Bushnell, Esq.

(57) ABSTRACT

A donor substrate and a method of forming an organic semiconductor layer pattern using the donor substrate, whereby a donor substrate is formed using an organic semiconductor precursor having a thermally decomposable substituent through a wet process, the organic semiconductor precursor substrate in the donor substrate is transferred to a receptor substrate as a pattern and heated, and thus is changed into an organic semiconductor. As a result, an organic semiconductor layer pattern is obtained. The method can be used in the manufacture of various devices such as organic light emitting diode and organic thin film transistor. A low-molecular weight organic semiconductor layer pattern can be formed through a wet process, not through deposition. Thus, using the method, a flat display device can be conveniently manufactured at low cost.

16 Claims, 3 Drawing Sheets

METHOD OF FORMING ORGANIC SEMICONDUCTOR LAYER PATTERN

CROSS-REFERENCE TO RELATED PATENT APPLICATION AND CLAIM OF PRIORITY

This application claims the benefit of Korean Patent Application No. 10-2005-0052720, filed on Jun. 18, 2005, in the Korean Intellectual Property Office, the disclosure of which is incorporated herein in its entirety by reference.

BACKGROUND OF THE INVENTION

1. Field of the Invention

The present invention relates to a method of forming an organic semiconductor layer pattern, and more particularly, to a method of forming an organic semiconductor pattern that can be used in the manufacture of various devices including display devices such as organic light emitting diodes (OLEDs), organic thin film transistors (OTFTs), etc.

2. Description of the Related Art

Recently, various flat display devices that can overcome drawbacks of cathode ray tubes, i.e., heavy weight and large volume, have been developed. Presently available flat display devices include plasma display panels (PDPs), liquid crystal displays (LCDs), field emission displays (FEDs), etc.

PDPs, among these flat display devices, are lightweight, thin and small and can be manufactured through simple processes and thus are drawing attention as the most suitable display for large screen display. However, PDPs also have drawbacks of low light-emitting efficiency, low brightness, and high power consumption. Contrary to this, although active matrix LCDs in which thin film transistors are used as switching devices are difficult to be used for large screen display because semiconductor manufacturing processes are used to manufacture the active matrix LCDs, the demand for the active matrix LCDs are increasing due to its use as display devices for laptop computers. However, LCDs have drawbacks such as high power consumption due to the use of a backlight unit. In addition, LCDs lead to a lot of light loss due to the use of optical devices such as a polarizing filter, a prism sheet, and a diffusion plate, etc. and have a small viewing angle.

A new display market trend in the information society will be lead by displays such as paper-like flexible displays, which can provide high quality display and pursuit user's convenience in the mobile field. In order to implement such displays, flexible and durable active driving devices should be made with low-cost processes that can be easily applied to develop active driving device arrays.

In the development of such flexible display devices, a patterning process using an organic semiconductor material is one of the important fields involved. Since the development of polyacetylene that is a conjugated organic polymer having semiconductor characteristics, due to the advantages of organic materials such as the diversity of synthesis methods thereof, the ability to be easily molded in fiber or film form, flexibility, conductivity, low-production cost, etc., research into organic semiconductors as new electric and electronic materials has been intensively performed in various fields, for example, in the functional electronic device field, optical device field, etc.

Processes using an organic semiconductor material can be roughly classified into polymer semiconductor processes and organic semiconductor processes. In polymer semiconductor processes, polymer is used as a semiconductor material. In particular, a polymer semiconductor process is a technique including dissolving a polymer material in a solvent, coating the resultant solution on a substrate using, for example, spin coating, evaporating the solvent, and patterning the coated film. Meanwhile, an organic semiconductor process is a process using a low-molecular weight organic material, not polymer, and includes a patterning process using, in most cases, vacuum deposition. Pentacene is a representative low-molecular weight organic material.

For a monochromic device, organic light-emitting diodes using polymer can be simply manufactured using a spin-coating process and have a low driving voltage. However, the organic light emitting diodes using polymer have a low luminous efficiency and short lifetime. For a full-color device, polymer patterning is performed using an inkjet technique or a laser transfer technique to obtain red, green, and blue patterns. However, luminance characteristics such as efficiency, lifetime, etc., have to be optimized when applying an inkjet technique or a laser transfer technique. Especially, when using a laser transfer technique, most single polymeric materials are not easily transferred.

A low-molecular weight organic semiconductor such as pentacene hardly dissolves in a solvent and thus cannot be coated in film form. For this reason, when forming a pattern of such a low-molecular weight organic semiconductor on a substrate, a shadow mask method is used in most cases. In the shadow mask method, deposition is performed with a patterned shadow mask disposed adjacent to the substrate. The method of using a shadow mask is advantageous in that there is no need to perform a lithography process but has the following problems.

In particular, the shadow mask has to be thin enough to form a fine pattern therein. Accordingly, it is difficult to handle the shadow mask. In addition, the shadow mask is expensive and cannot be unlimitedly used since the shadow mask is disposed very close to the substrate on which a pattern will be formed. Furthermore, the radiation heat generated by a device used to heat a deposited material expands the shadow mask, thereby causing sagging of a center portion of the shadow mask. The sagging of the shadow mask become more serious as a larger substrate is used, thereby blocking the manufacture of high-definition, large-screen displays.

Therefore, there is an increasing need for a method of patterning a low-molecular weight material such as pentacene, not through deposition. Furthermore, if patterning can be performed at a temperature lower than a temperature required for deposition, it would be very attractive to manufacture future-oriented displays, etc.

SUMMARY OF THE INVENTION

The present invention provides a novel donor substrate that can be used to pattern an organic semiconductor layer.

The present invention provides a method of forming a low-molecular organic semiconductor pattern layer through a wet process, not deposition, using the donor substrate.

The present invention provides a flat display device manufactured using the method.

According to an aspect of the present invention, there is provided a donor substrate for forming an organic semiconductor layer, the donor substrate comprising: a base substrate; and a transfer layer containing an organic semiconductor precursor having a thermally decomposable substituent on the base substrate.

According to another aspect of the present invention, there is provided a donor substrate for forming an organic semiconductor layer, the donor substrate comprising: a base substrate; and a transfer layer formed on the base substrate, the transfer layer containing an organic semiconductor precursor, the organic semiconductor precursor comprising material which can be changed into an organic semiconductor when an energy source is applied to the organic semiconductor precursor.

According to still another aspect of the present invention, there is provided a method of forming an organic semiconductor layer pattern, the method comprising: preparing a donor substrate, the donor substrate comprising a base substrate and a transfer layer formed on the base substrate, the transfer layer containing an organic semiconductor precursor having a thermally decomposable substituent; and positioning the donor substrate to contact a receptor substrate and applying an energy source to the donor substrate to transfer the transfer layer to the receptor substrate to form an organic semiconductor layer pattern.

The preparation of the donor substrate comprises preparing an organic semiconductor precursor solution by dissolving the organic semiconductor precursor having the thermally decomposable substituent in a solvent; and forming the transfer layer by coating the organic semiconductor precursor solution on the base substrate and drying the solution to form the donor substrate.

According to yet another aspect of the present invention, there is provided a flat display device comprising the organic semiconductor layer pattern formed using the above-described method.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
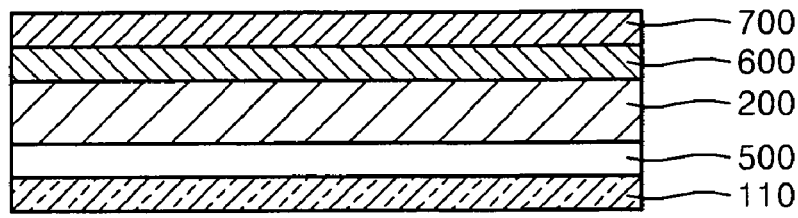
FIGS. 1A through 1F are sectional views of donor substrates according to embodiments of the present invention.
Figure 1B:
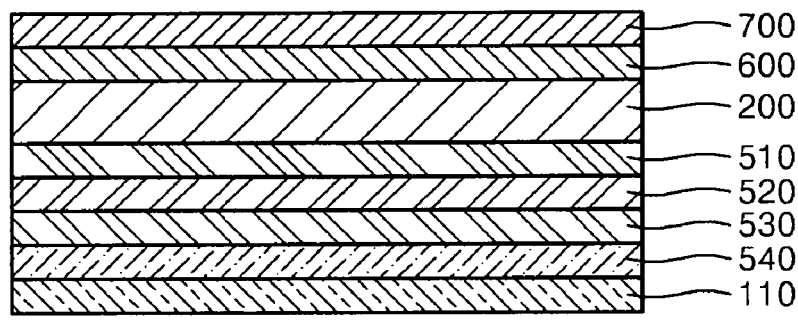
Figure 1C:
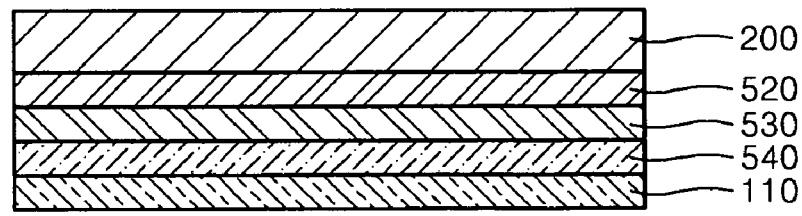
Figure 1D:
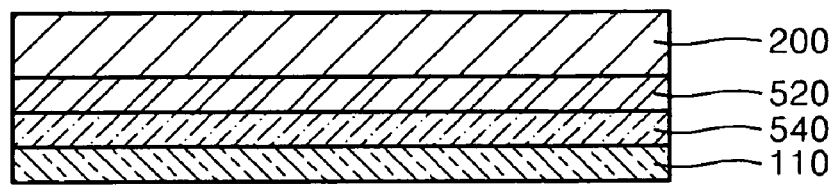
Figure 1E:
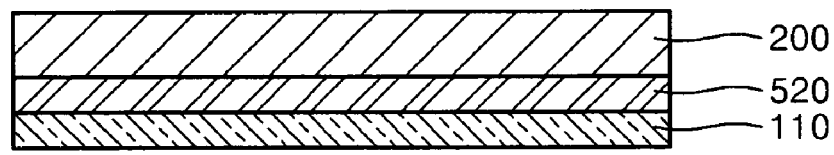
Figure 1F:
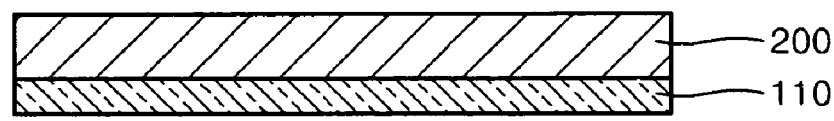

Hereinafter, the present invention will be described in detail.

In an aspect of the present invention, there is provided a donor substrate that can be used to form an organic semiconductor layer pattern.

The donor substrate according to the present invention includes a base substrate, and a transfer layer on the base substrate, the transfer layer containing an organic semiconductor precursor having a thermally decomposable substituent.

The organic semiconductor precursor having a thermally decomposable substituent has a medium- or low-molecular weight of 3000 or less and can be any material having a substitutent forming an organic material having semiconductor characteristics by being thermally decomposed. When being thermally decomposed, the organic semiconductor precursor having a thermally decomposable substituent may form a material selected from the group consisting of: pentacene; tetracene; anthracene; naphthalene; oligothiophenes such as α-4-thiophene, α-5-thiophene, and α-6-thiophene, and their derivatives; thienophene and its derivative; sexithiophene and its derivative; oligophenylene and its derivative; thiophenylene vinylene and its derivative; perylene and its derivative; dioxaborine and its derivative; rubrene and its derivative; coronene and its derivative; perylene tetracarboxylic diimide and its derivative; perylene tetracarboxylic dianhydride and its derivative; oligoacene of naphthalene and its derivative; phthalocyanine containing or not containing metal and its derivative; quinodimethane and its derivative; pyromellitic dianhydride and its derivative; or pyromellitic diimide and its derivative. Examples of materials that can be formed by the organic semiconductor precursor are not limited thereto.

For particular example, the organic semiconductor precursor having a thermally decomposable substituent may be a material that can form pentacene by being thermally decomposed. For example, the organic semiconductor precursor having a thermally decomposable substituent may be pentacene substituted with N-sulfinyl group as represented by formula (1) below or organic semiconductor precursors of formulae (2) through (4):

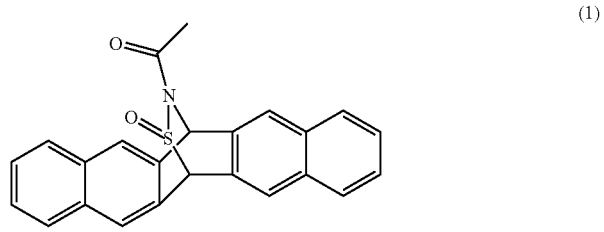

(1)

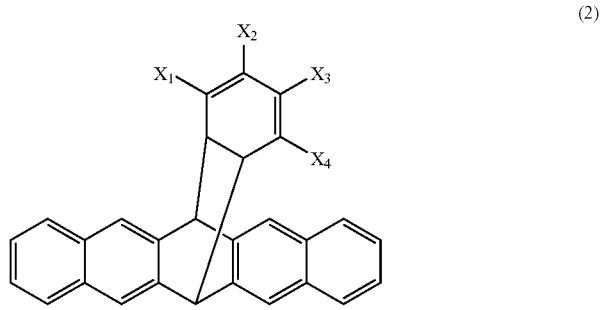

(2)

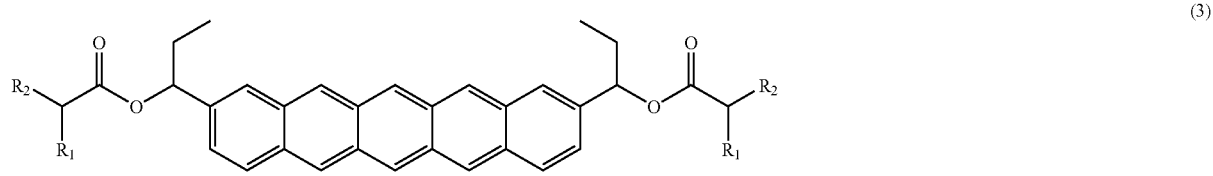

(3)

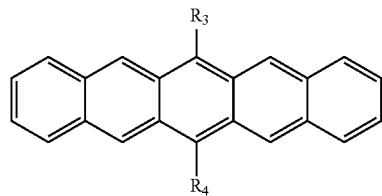

(4)

where each of $R_1$ and $R_2$ is independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons; $R_3$ and $R_4$ are each independently an alkyl group having 4 to 40 carbons, a silyl group having 3 to 40 carbons, or a siloxyl group having 3 to 40 carbons; $X_1$, $X_2$, $X_3$ and $X_4$ are each independently hydrogen or a halogen atom, and at least one of $X_1$, $X_2$, $X_3$ and $X_4$ is not a hydrogen atom. For example, $R_3$ and $R_4$ may be butyl, pentyl, hexyl, heptyl, octyl, trimethylsilyl, triethylsilyl, or triisopropylsilyl.

Further, the organic semiconductor precursor having a thermally decomposable substituent may be a polymer-bound pentacene precursor compound of formula (5), (i.e., a polymer containing an organic semiconductor precursor having a thermally decomposable substituent described above):

(5)

where R is selected from the group consisting of derivatives of pentacene substituted with N-sulfinyl amide group, and compounds represented by formulae (2) through (4).

The thermally decomposable substituent is not specifically limited and can be any substituent that can be thermally decomposed, for example, at 100 to 250° C. Examples of the thermally decomposable substituent include an ester group having 3 to 40 carbons, a t-butylester group having 3 to 40 carbons, a t-butylsilyl group having 3 to 40 carbons or an N-sulfinyl amide group.

The thermally decomposable substituent is separated from the organic semiconductor precursor when thermally decomposed, and the organic semiconductor precursor changes into a corresponding organic semiconductor.

The base substrate may be any substrate that can thermally transfer an organic semiconductor precursor coated thereon to a receptor substrate, and is not particularly limited. Examples of such a base substrate include polyesters; polyether sulfone; polystyrene; polyethylene; polypropylene; polyamide; polyimide; cellulose-based resins; polyurethane; fluorine-based resins such as polytetrafluoroethylene; vinyl compounds such as polyvinyl chloride; polyacrylate; polyacrylate ester; polyacrylonitrile; an addition polymer of a vinyl compound; polymethacrylate; polymethacrylate ester; vinylidene compounds such as polyvinylidene chloride; a fluorinated vinylidene/trifluoroethylene copolymer; a copolymer of vinyl compounds or fluorine-based compounds such as ethylene/vinylacetate copolymer; polyethers such as polyethylene oxide; an epoxy resin; polyvinyl alcohol; transparent elastomers of polyvinyl butyral such as silicon rubber, urethane rubber, acrylic rubber, styrene-butadiene rubber, soft polyvinyl chloride; elastomers of ethylenic copolymers such as ethylene-propylene copolymer, ethylene-butene copolymer, ethylene-vinyl acetate copolymer; ethylene-based transparent compositions such as a crosslinked mixture of an ethylenic copolymer and an ethylene-propylene-diene copolymer; thermoplastic elastomers such as styrenic thermoplastic elastomer, urethane-based thermoplastic elastomer, etc. Preferred examples of the base substrate include polyethyleneterephthalate, polyvinyl chloride, polystyrene, polypropylene, polyester, polytetrafluoroethylene, and polyacrylate, wherein a more preferred example is polyethyleneterephthalate.

The donor substrate can include various layers such as a light-to-heat conversion layer, an anchoring layer, a primer layer, a heat-resistant lubricant layer, an intermediate layer, a mold-releasing layer, and a subbing layer. Various donor substrates according to embodiments of the present invention will be described with reference to FIGS. 1A through 1E.

FIG. 1A is a sectional view of a donor substrate according to an embodiment of the present invention.

The donor substrate of FIG. 1A may include an anchoring layer 500 between a base substrate 200 and an organic semiconductor precursor layer 110. The anchoring layer 500 binds the base substrate 200 and the organic semiconductor precursor layer 110 to each other not to be separated from one another. A common material and method known in the field can be used to form the anchoring layer 500 without limitations.

A heat-resistant lubricant layer 700 may be further formed on a surface of the base substrate 200 opposite to the organic semiconductor precursor layer 110. The heat-resistant lubricant layer 700 prevents other film layers from being melt by the heat applied during a transferring process and contaminating a heat source. A common material and method known in the field can be used to form the heat-resistant lubricant layer 700 without limitations.

The donor substrate of FIG. 1 may further include a subbing layer 600 between the base substrate 200 and the heat-resistant lubricant layer 700 to relieve the impact caused by heat and physical scratching. A common material and method known in the field can be used to form the subbing layer 600 without limitations.

FIGS. 1B through 1F are sectional views of donor substrates according to embodiments of the present invention.

Referring to FIGS. 1B through 1F, a light-to-heat conversion layer 520 converts externally received light into heat such that only a light-irradiated portion is transferred. A primer layer 510 enhances the adhesion between the base substrate 200 and the light-to-heat conversion layer 520. An intermediate layer 530 prevents damage or contamination of a portion of the organic semiconductor precursor layer 110 that is transferred. A mold-releasing layer 540 allows the transferred portion to be easily separated and makes a transferring operation easier.

The primer layer 510, the light-to-heat conversion layer 520, the intermediate layer 530, and the mold release layer 540 can be layers well known in the art and are not particularly limited.

According to another aspect of the present invention, there is provided a method of forming an organic semiconductor layer pattern, the method comprising: (a) preparing an organic semiconductor precursor solution by dissolving an organic semiconductor precursor having a thermally decomposable substituent in a solvent; (b) forming a transfer layer by uniformly coating the organic semiconductor precursor solution on a base substrate and drying the solution, thereby resulting in a donor substrate; and (c) positioning the donor substrate obtained in operation (b) to contact a receptor substrate and applying an energy source to the donor substrate to transfer the transfer layer to the receptor substrate, thereby resulting in an organic semiconductor layer pattern.

In the method of forming an organic semiconductor pattern according to the present invention, initially, an organic semiconductor precursor having a thermally decomposable substituent is dissolved in a solvent to prepare an organic semiconductor precursor solution.

Examples of the organic semiconductor precursor having a thermally decomposable substituent that can be used in the method are the same as described above.

For example, the organic semiconductor precursor having a thermally decomposable substituent may be any material that can form pentacene by being thermally decomposed. Pentacene is an aromatic hydrocarbon material in which five benzene rings are linearly linked each other. In this structure, benzene molecules with double and single bonds are consecutively linked, and the movement of electrons in the molecules is very fast. The migration of electrons between molecules takes place by hopping of electrons, and thus the close packing of molecules directly affects on the mobility of carriers. Thus, pentacene can provide very high field-effect mobility.

Preferably, the organic semiconductor precursor having a thermally decomposable substituent may be organic semiconductor precursors of formulae (1) through (5) above.

A solvent that can be used in preparing the organic semiconductor precursor solution may be any single-component solvent or multi-component solvent that can dissolve the organic semiconductor precursor. Examples of the solvent include, but are not limited to, a halogen solvent, an alcoholic solvent, a keton solvent, an ester solvent, an aliphatic hydrocarbon solvent, an aromatic hydrocarbon solvent, an ether solvent, or a mixture thereof. Particular and non-limiting examples of the solvent includes water, acetone, methanol, ethanol, isopropyl alcohol, n-propyl alcohol, butyl alcohol, dimethyl acetamide (DMAc), dimethyl imidazoline (DMI), dimethyl formamide, tetrachloroethane, dimethyl sulfoxide (DMSO), N-methyl-2-pyrollidone (NMP), tetrahydrofuran (THF), tetrabutyl acetate, n-butyl acetate, m-cresol, toluene, xylene, ethyleneglycol (EG), γ-butyrolactone, hexafluoroisopropanol (HFIP), etc., which can be used alone or in combination.

The organic semiconductor precursor solution may further contain a surfactant and/or a dispersant.

Examples of the surfactant include, but are not limited to, a nonionic surfactant such as sorbitan monooleate, POE sorbitan monooleate, N,N'-dimethyl formamide dicyclohexyl acetal, polyoxyethylene alkyl amine, glycerol, and fatty acid ester; a cationic surfactant such as an amine salt and quaternary ammonium salt; an anionic surfactant such as dialkyl sulfosuccinate, alkyl-alphasulfocarbonate, petroleum sulfonate, alkylnaphthalene sulfonate, phosphoric esterate, alkyl phosphate, etc.; an amphiphatic surfactant such as N-lauryl-β-acetic acid, N-lauryl-β-aminopropionic acid, N-lauryl-β-aminobutyric acid, aminocarboxylic acid, betanate, etc.

The dispersant may be, but is not limited to, at least one selected from among a saturated fatty acid such as palmitic acid or stearic acid having 16 to 20 carbons; an unsaturated fatty acid such as oleic acid and linolenic acid having 16 to 18 carbons; metal salts of these saturated/unsaturated fatty acids with sodium, potassium, calcium, zinc, copper, etc.

In addition, the organic semiconductor precursor solution may further contain a thickening agent, an antistatic agent, etc.

The organic semiconductor precursor solution prepared described above is uniformly coated on a base substrate to form a donor substrate.

The base substrate can be formed of any of the materials described above.

A method of uniformly coating the organic semiconductor precursor solution uniformly on the base substrate may be any method well known in the art, and is not particularly limited. Specific examples of the method include spin coating, spray coating, roll coating, dip coating, knife coating, etc.

The thickness of an organic semiconductor precursor layer formed by uniformly coating the organic semiconductor precursor solution is preferably about 30 to 50 μm. When the thickness of the organic semiconductor precursor layer exceeds 50 μm, a transfer portion is too thick so that thermal energy cannot be effectively transferred, and thus a sharp pattern cannot be obtained.

The substrate coated as described above is dried to remove the remaining solvent, thereby forming a donor substrate. Drying conditions are not particularly limited. However, the drying process can be performed at room temperature or an elevated temperature of 50-100° C. in an air atmosphere or in a nitrogen atmosphere. Quicker drying can be achieved under reduced pressure with forced air convection.

The donor substrate can further include various layers such as a light-to-heat conversion layer, an anchoring layer, a primer layer, a heat-resistant lubricant layer, an intermediate layer, a mold-releasing layer, a subbing layer, etc. The functions and the materials of these layers, and the methods used to form these layers are the same as described above.

In order to transfer the organic semiconductor precursor of the donor substrate to a receptor substrate, the organic semiconductor precursor layer on the donor substrate is brought to contact the receptor substrate and energy is applied to the donor substrate according to a desired pattern. Methods of applying energy includes, but are not limited to, a method of directly supplying heat, a method of using heat generated or induced by light, pressure, or electricity. During the transferring process, the thermally decomposable substituent of the organic semiconductor precursor is decomposed by the heat and converted into an organic semiconductor.

When using a direct heat supplying method in the transferring process, heat can be supplied to only a selected portion of the donor substrate to be pattern at a temperature of 90-230° C.

When using light in the transferring process, the donor substrate is scanned by IR laser. The duration of irradiation can be varied according to the intensity of the radiated light.

When using light in the transferring process, the donor substrate may further include a light-to-heat conversion layer between the base substrate and the organic semiconductor precursor layer. The light-to-heat conversion layer can be formed of a light-absorbing material absorbing light in infrared-visible light ranges. Examples of material layers having this characteristic include a metal layer formed of aluminum or its oxide and/or sulfide; an organic layer formed of a polymer containing carbon black, graphite, or an infrared dye, etc. The metal layer can be coated to a thickness of 100-5000 Å through vacuum deposition, electron beam deposition, or sputtering.

When the donor substrate further includes a light-to-heat conversion layer as described above, an intermediate layer can be further formed between the light-to-heat conversion layer and the organic semiconductor precursor layer to allow easy separation of the organic semiconductor precursor layer from the light-to-heat conversion layer. The intermediate layer may be formed of a material such as a thermosetting polymer, a thermoplastic polymer, a crosslinkable polymer of polyacrylate, polymethacrylate, polyester, epoxide, or polyurethane.

When using pressure in the transferring process, a pressure of 100 mPa to 10 kPa may be applied along a desired pattern.

After the transferring process, a heat treatment may be further performed. The thermal treatment may be performed according to a method and conditions known in the field without limitations. However, the thermal treatment may be performed at a temperature of 90-230° C.

When using electricity in the transferring process, an electricity of 1 mA/cm$^2$ to 10 A/cm$^2$ can be applied.

A common material known in the art can be used for the receptor substrate without limitations. A suitable material for the receptor substrate should have good surface uniformity, large mechanical strength, and excellent light transmitting property for use in displays. For example, one of silicon, glass, and a transparent plastic can be used.

The organic semiconductor precursor layer transferred to the receptor substrate as described above may act as one of the electron injection layer, the electron transport layer, the light emitting layer, the hole transport layer, and the hole injection layer of an organic light emitting device or as a channel layer of an organic TFT.

The method of forming an organic semiconductor pattern according to the present invention may further include a thermal treatment. When the organic semiconductor precursor transferred to the receptor substrate through the above-described processes, the substituent of the organic semiconductor precursor that did not thermally decompose through the transferring process decomposes, and thus the organic semiconductor precursor fully changes into an organic semiconductor. Conditions for the thermal processes are not specifically limited and can be appropriately varied according to the type of substitute to decompose.

The thermal process may be performed at a temperature of 90-230° C. for 0.5-30 minutes. When the temperature of the thermal process is lower than 90° C., or when the duration of the thermal process is shorter than 0.5 minutes, the thermal decomposition of the substituent is not sufficient, and thus the performance of a device deteriorates. When the temperature of the thermal process is higher than 230° C. or when the duration of the thermal process is longer than 30 minutes, unnecessary extra thermal decomposition occurs.

As the substituent of the organic semiconductor precursor thermally decomposes, the organic semiconductor precursor changes into a corresponding organic semiconductor.

The organic semiconductor can be pentacene; tetracene; anthracene; naphthalene; oligothiophenes such as α-4-thiophene, α-5-thiophene, and α-6-thiophene, and their derivatives; thienophene and its derivative; sexithiophene and its derivative; oligophenylene and its derivative; thiophenylene vinylene and its derivative; perylene and its derivative; dioxaborine and its derivative; rubrene and its derivative; coronene and its derivative; perylene tetracarboxylic diimide and its derivative; perylene tetracarboxylic dianhydride and its derivative; oligoacene of naphthalene and its derivative; phthalocyanine containing or not containing metal and its derivative; quinodimethane and its derivative; pyromellitic dianhydride and its derivative; or pyromellitic diimide and its derivative, but the organic semiconductor is not limited thereto. In an embodiment, the organic semiconductor can be pentacene.

According to another aspect of the present invention, there is provided a flat display device comprising an organic semiconductor layer prepared using the patterning method described above. The flat display device includes display devices such as organic light-emitting diode display devices, organic TFTs, etc.

Hereinafter, the present invention will be described in greater detail with reference to the following examples. The following examples are for illustrative purposes only and are not intended to limit the scope of the invention.

EXAMPLE 1

15 g of the compound of formula (1) as an organic semiconductor precursor was added to 35 g of toluene and dissolved while stirring for 60 minutes to obtain a homogeneous organic semiconductor precursor solution.

4-chlorophenol was uniformly spin-coated as an anchoring layer on a PET base substrate and dried for 1 hour at room temperature.

The organic semiconductor precursor solution prepared above was uniformly coated on the dried anchoring layer through spin-coating to form a donor substrate. The donor substrate was dried in a hood at 100° C. for 1 hour.

The dried donor film was brought to contact a glass substrate and thermally transferred to the glass substrate at 150° C. The glass substrate with a transferred pattern was heated at 210° C. for 10 minutes to thermally decompose the compound of formula (1) completely and form an organic semiconductor layer pattern.

EXAMPLE 2

Figure 2:
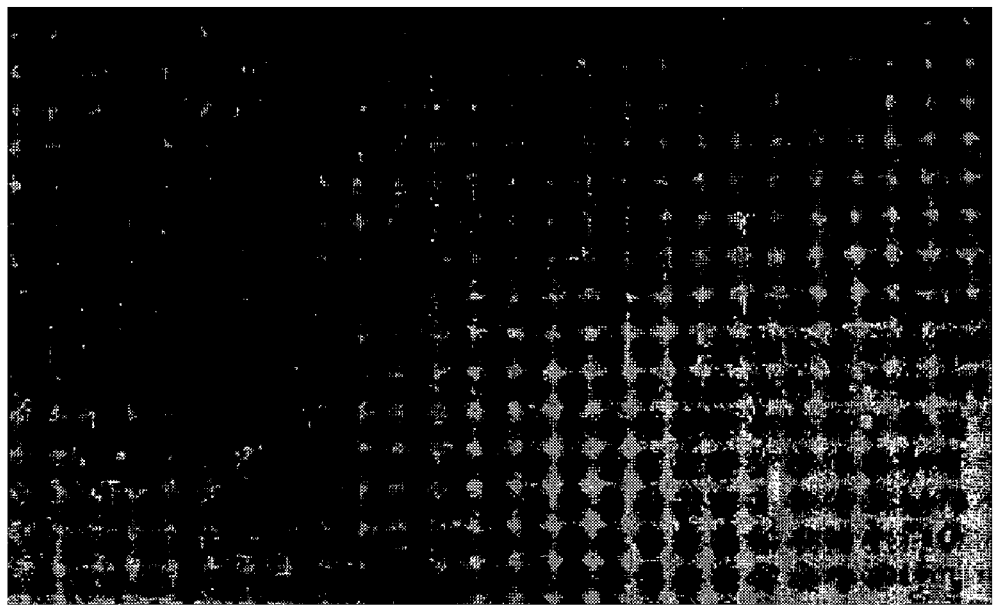
FIG. 2 is a photograph of a pattern formed using a donor substrate according to an embodiment of the present invention.

A donor film prepared in the same manner as in Example 1 was used. An organic semiconductor layer pattern was formed in the same manner as in Example 1, except that a polyethylenenaphthalate (PEN) plastic substrate was used as the receptor substrate. FIG. 2 is a photograph of the organic semiconductor layer pattern formed in Example 2.

A method of forming an organic semiconductor layer pattern according to the present invention can be used in the manufacture of various devices such as OLED, and OTFT. According to the present invention, a low-molecular weight organic semiconductor layer pattern can be formed through a wet process, not through deposition. Thus, using the method according to the present invention, a flat display device can be conveniently manufactured at low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming an organic semiconductor layer pattern, comprised of:
preparing a donor substrate comprising:
a base substrate; and
a transfer layer formed on the base substrate, the transfer layer containing an organic semiconductor precursor having a thermally decomposable substituent, the organic semiconductor precursor forming pentacene when the thermally decomposable substituent of the organic semiconductor precursor is thermally decomposed by an application of an energy source, wherein, when the pentacene is formed the organic semiconductor precursor having a thermally decomposable substituent is at least one selected from the group consisting of compounds of formulae (3) through (5)

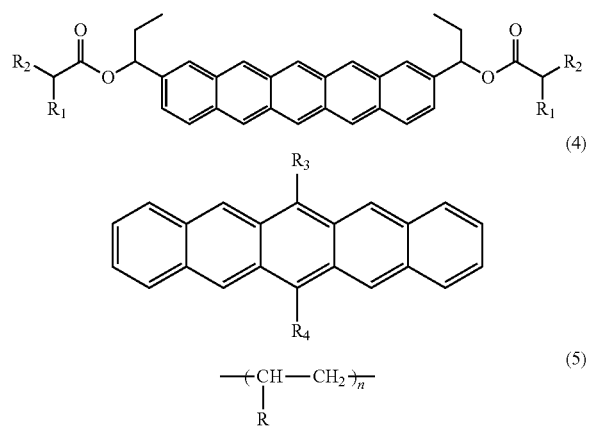

where each of $R_1$ and $R_2$ is independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons;

$R_3$ and $R_4$ are each independently an alkyl group having 4 to 40 carbons, a silyl group having 3 to 40 carbons, or a siloxyl group having 3 to 40 carbons;

R is selected from the group consisting of the compounds represented by formulae (3) and (4); and positioning the donor substrate to contact a receptor substrate and transferring the transfer layer to the receptor substrate to form an organic semiconductor layer pattern upon application of the energy source.

2. The process of claim 1, wherein the thermally decomposable substituent is at least one selected from the group consisting of an ester group having 3 to 40 carbons, a t-butylester group having 3 to 40 carbons, a t-butylsilyl group having 3 to 40 carbons and an N-sulfinyl amide group.

3. The process of claim 1, further comprising the donor, substrate comprised of at least one layer selected from the group consisting of a light-to-heat conversion layer, an anchoring layer, a primer layer, a heat-resistant lubricant layer, an intermediate layer, a mold-releasing layer, and a subbing layer.

4. The process of claim 1, wherein a thickness of transfer layer is about 30 to 50 μm.

5. A method for forming an organic semiconductor layer pattern, comprised of:
preparing a donor substrate comprising:
a base substrate; and
a transfer layer formed on the base substrate, the transfer layer containing an organic semiconductor precursor, the organic semiconductor precursor comprising material which can be changed into an organic semiconduaor when an energy source is applied to the organic semiconductor precursor, the organic semiconductor precursor forming pentacene when the thermally disposable substituent of the organic semiconductor precursor is thermally decomposed, wherein, when the pentacene is formed, the organic semiconductor precursor having a thermal decomposable substituent is at least one selected from the group consisting of compounds of formulae (3) through (5)

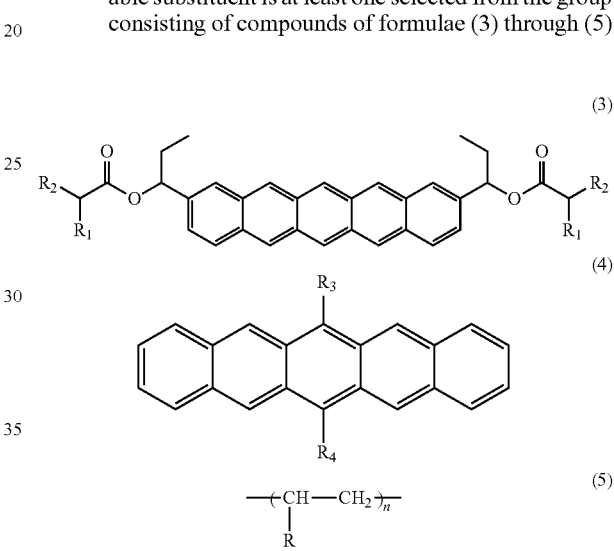

where each of $R_1$ and $R_2$ is independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons;

$R_3$ and $R_4$ are each independently an alkyl group having 4 to 40 carbons, a silyl group having 3 to 40 carbons, or a siloxyl group having 3 to 40 carbons;

R is selected from the group consisting of the compounds represented by formulae (3) and (4), and positioning the donor substrate to contact a receptor substrate and transfer the transfer layer to the receptor substrate to form an organic semiconductor layer pattern.

6. The method of claim 5, wherein the preparation of the donor substrate comprises:
preparing an organic semiconductor precursor solution by dissolving the organic semiconductor precursor having the thermally decomposable substituent in a solvent; and
forming the transfer layer by coating the organic semiconductor precursor solution on the base substrate and drying the solution to form the donor substrate.

7. A method of forming an organic semiconductor layer pattern, the method comprising:
preparing a donor substrate, the donor substrate comprising a base substrate and a transfer layer formed on the base substrate, the transfer layer containing an organic semiconductor precursor having a thermally decomposable substituent; and
positioning the donor substrate to contact a receptor substrate and applying an energy source to the donor substrate to transfer the transfer layer to the receptor substrate to form an organic semiconductor layer pattern, the organic semiconductor precursor forming pentacene when the thermally decomposable substituent of the organic semiconductor precursor is thermally decomposed by the applied energy source, wherein, when the pentacene is formed, the organic semiconductor precursor having a thermally decomposable substituent is at least one selected from the group consisting of compounds of formulae (3) through (5):

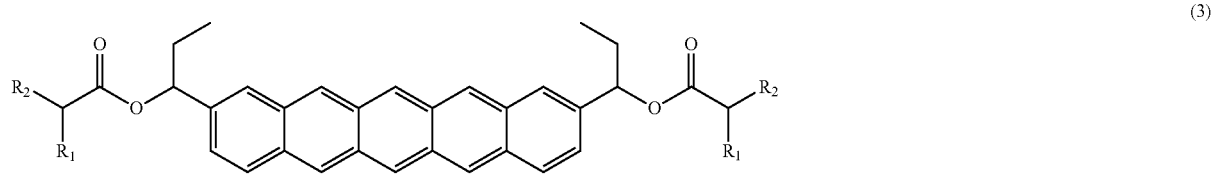
(3)

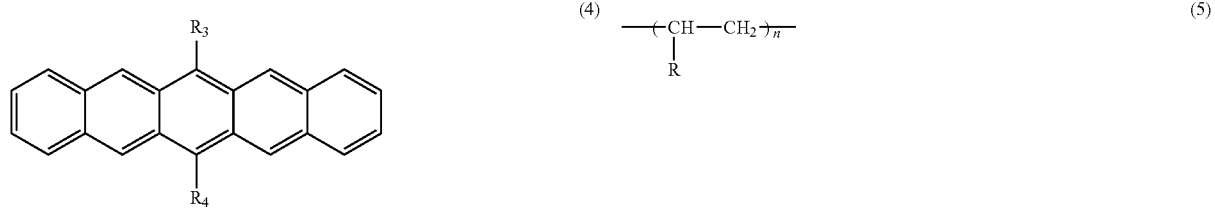
(4)          (5)

where each of $R_1$ and $R_2$ is independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons;
$R_3$ and $R_4$ are each independently an alkyl group having 4 to 40 carbons, a silyl group having 3 to 40 carbons, or a siloxyl group having 3 to 40 carbons; and
R is selected from the group consisting of the compounds represented by formulae (3) and (4).

8. The method of claim 7, wherein the preparation of the donor substrate comprises:
preparing an organic semiconductor precursor solution by dissolving the organic semiconductor precursor having the thermally decomposable substituent in a solvent; and
forming the transfer layer by coating the organic semiconductor precursor solution on the base substrate and drying the solution to form the donor substrate.

9. The method of claim 7, wherein a thickness of the transfer layer formed on the base substrate is about 30 to 50 μm.

10. The method of claim 7, further comprising performing a thermal treatment on the organic semiconductor layer pattern transferred to the receptor substrate.

11. The method of claim 10, wherein the thermal treatment is performed at a temperature of 100 to 250° C. for 0.5 to 30 minutes.

12. The method of claim 7, wherein the thermally decomposable substituent is at least one selected from the group consisting of an ester group having 3 to 40 carbons, a t-butylester group having 3 to 40 carbons, a t-butylsilyl group having 3 to 40 carbons and an N-sulfinyl amide group.

13. The method of claim 7, wherein the energy source applied to the donor substrate is one of heat, light, pressure, and electricity.

14. The method of claim 7, further comprising coating on the base substrate at least one layer selected from the group consisting of a light-to-heat conversion layer, an anchoring layer, a primer layer, a heat-resistant lubricant layer, an intermediate layer, a mold-releasing layer, and a subbing layer.

15. The method of claim 7, wherein the organic semiconductor layer pattern is at least one selected from the group consisting of an electron injection layer, an electron transport layer, a light emitting layer, a hole transport layer, and a hole injection layer of an organic light emitting diode display device.

16. The method of claim 7, wherein the organic semiconductor layer pattern is a channel layer of an organic thin film transistor.

* * * * *